(12) United States Patent
Tu et al.

(10) Patent No.: US 8,232,122 B2
(45) Date of Patent: Jul. 31, 2012

(54) METHOD FOR FABRICATING LIGHT EMITTING DIODE CHIP

(75) Inventors: Po-Min Tu, Hsinchu (TW); Shih-Cheng Huang, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/207,439

(22) Filed: Aug. 11, 2011

(65) Prior Publication Data
US 2012/0171791 A1 Jul. 5, 2012

(30) Foreign Application Priority Data
Dec. 29, 2010 (CN) .................. 2010 1 0611477.5

(51) Int. Cl.
*H01L 21/00* (2006.01)
(52) U.S. Cl. ............ 438/33; 438/41; 438/751; 438/945; 257/E21.034
(58) Field of Classification Search .................... 438/33, 438/34, 41, 751, 945; 257/E21.306, E21.034, 257/E21.117
See application file for complete search history.

(56) References Cited

U.S. PATENT DOCUMENTS

| | | | | |
|---|---|---|---|---|
| 6,025,251 A * | 2/2000 | Jakowetz et al. | ............. | 438/464 |
| 2009/0162959 A1* | 6/2009 | Hsu et al. | ........................ | 438/33 |
| 2009/0291518 A1* | 11/2009 | Kim et al. | ........................ | 438/33 |
| 2010/0075463 A1* | 3/2010 | Smith et al. | .................... | 438/118 |
| 2011/0095332 A1* | 4/2011 | Hwang et al. | ................. | 257/103 |

* cited by examiner

*Primary Examiner* — Jarrett Stark
*Assistant Examiner* — John M Parker
(74) *Attorney, Agent, or Firm* — Altis Law Group, Inc.

(57) ABSTRACT

A method for fabricating an LED chip is provided. Firstly, a $SiO_2$ pattern layer is formed on a top surface of a substrate. Then, lighting structures are grown on a portion of the top surface of substrate without the $SiO_2$ pattern layer thereon. Thereafter, the $SiO_2$ pattern layer is removed by wet etching to form spaces between bottoms of the lighting structures and substrate. An etching solution is used to permeate into the spaces and etch the lighting structures from the bottoms thereof, whereby the lighting structures each with a trapezoid shape is formed. Sidewalls of each of the lighting structures are inclined inwardly along a top-to-bottom direction.

12 Claims, 8 Drawing Sheets

METHOD FOR FABRICATING LIGHT EMITTING DIODE CHIP

TECHNICAL FIELD

The disclosure generally relates to a method for fabricating a light emitting diode chip.

DESCRIPTION OF RELATED ART

In recent years, due to excellent light quality and high luminous efficiency, light emitting diodes (LEDs) have increasingly been used to substitute for incandescent bulbs or compact fluorescent lamps or fluorescent tubes as a light source of an illumination device.

A light emitting diode is conventionally fabricated into a cuboid shape. As there is great difference between the reflective indexes of air or package materials and materials of the LED chip, the light emitted by the LED chip with an incident angle greater than the total reflection critical angle will be reflected back. Therefore, the light extraction efficiency of the LED chip is decreased. In order to improve the light extraction efficiency of the LED chip, the LED chip can be changed to a trapezoid shape, wherein sidewalls of the LED chip are inclined inwardly along a top-to-bottom direction, thereby reducing the total internal reflection and enhancing extraction of light generated by the LED chip. A wet etching method is usually used to process the LED chip to obtain the desired shape. However, the material of the LED chip, such as GaN, is generally difficult to be etched; the etching of the LED chip takes a long time and proceeds at a temperature higher than 170° C.

Therefore, a method for fabricating a light emitting diode chip is desired to overcome the above described shortcomings.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

An embodiment of a method for fabricating an LED chip will now be described in detail below and with reference to the drawings.

Figure 1:
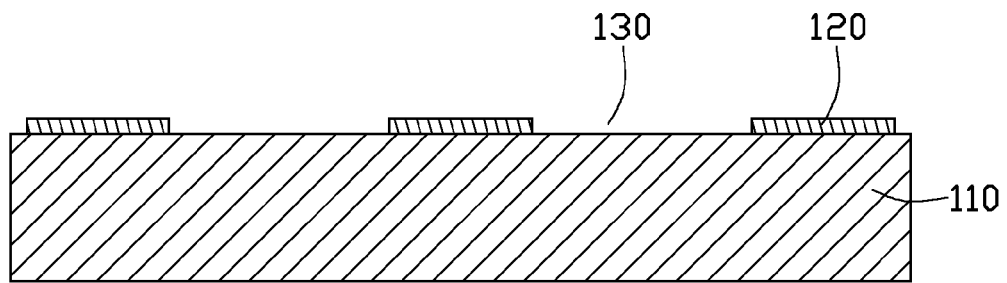
FIG. 1 to FIG. 8 are diagrams schematically showing different steps of a method for fabricating an LED chip according to an embodiment of the present disclosure.
Figure 2:
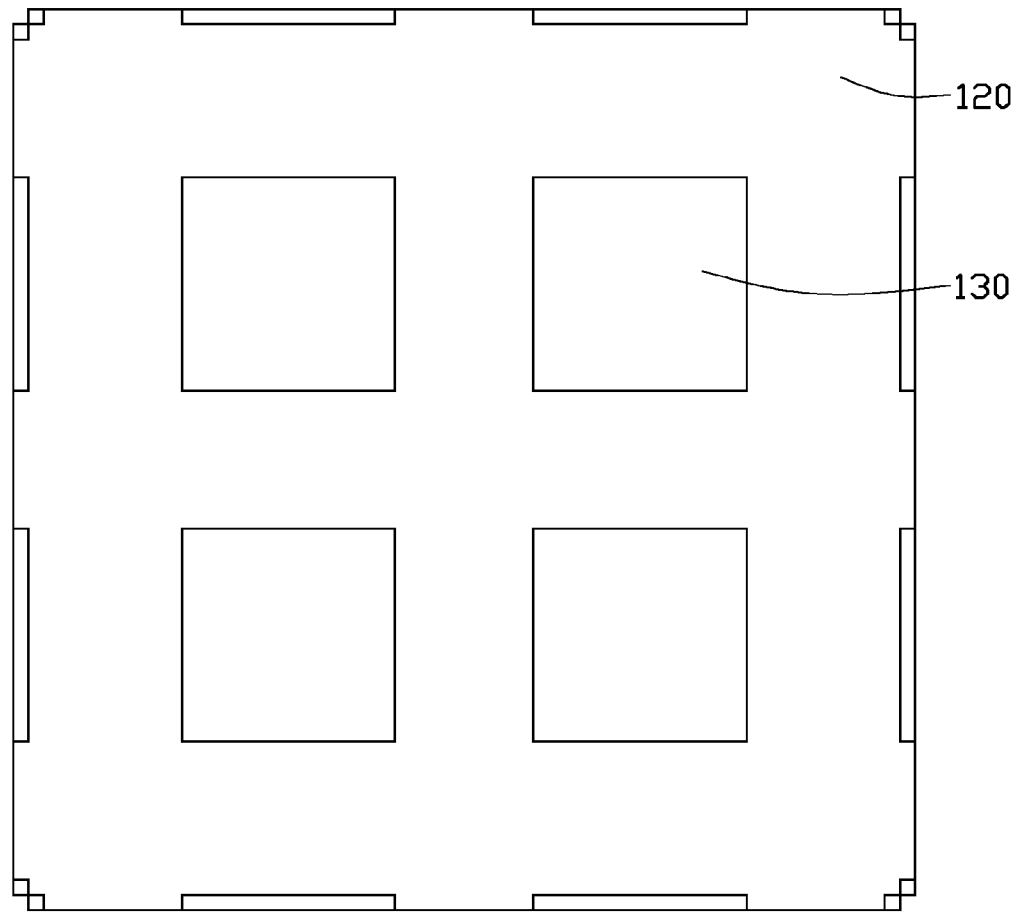

Referring to FIG. 1, firstly, a substrate 110 is provided. The substrate 110 can be selected from a group consisting of a sapphire substrate, a SiC substrate and a SiN substrate. A $SiO_2$ pattern layer 120 is formed on a top surface of the substrate 110. Portions of the top surface of the substrate 110 without the $SiO_2$ pattern layer 120 thereon form epitaxial regions 130. In this embodiment, a thickness of the substrate 110 is about 430 μm. Further referring to FIG. 2, the $SiO_2$ pattern layer 120 includes a number of lines intersecting to each other and forming a grid structure. The epitaxial regions 130 each are square-shaped. A width of each of the lines of the $SiO_2$ pattern layer 120 is about 20 μm, and a length of a side of the epitaxial regions 130 is about 300 μm. In alternative embodiments, the shape of the $SiO_2$ pattern layer 120 can also be parallel strips, circles or polygons. Besides, the substrate 110 can also be made of a patterned sapphire substrate (PSS).

Figure 3:
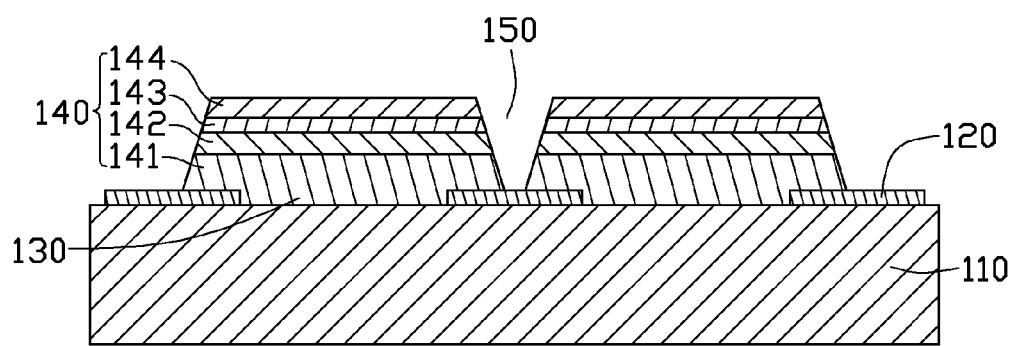

Referring to FIG. 3, a lighting structure 140 is formed on each of the epitaxial regions 130. In this embodiment, the lighting structure 140 includes a GaN buffer layer 141, an n-type GaN layer 142, an InGaN/GaN multiple quantum well (MQW) layer 143 and a p-type GaN layer 144 arranged subsequently along a direction away from the substrate 110. The GaN buffer layer 141 not only covers the epitaxial region 130, but also covers adjacent portions the $SiO_2$ pattern layer 120. A thickness of the n-type GaN layer 142 is about 4 μm, and a thickness of the p-type GaN layer 144 is about 0.1 μm. By selecting appropriate size of the $SiO_2$ pattern layer 120 and adjusting the condition of epitaxial growth, gaps 150 are defined between two adjacent lighting structures 140 over the $SiO_2$ pattern layer 120, thereby exposing a part of the $SiO_2$ pattern layer 120 between the two adjacent lighting structures 140.

Figure 4:
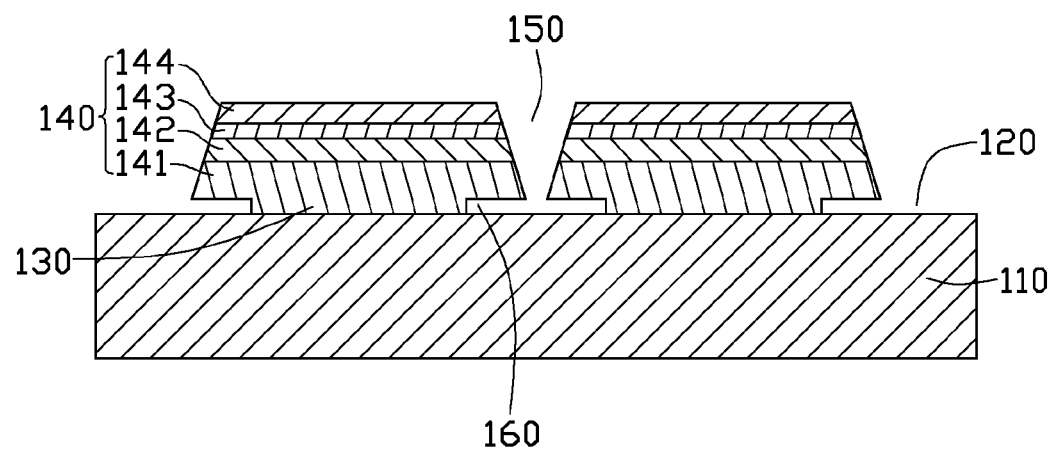

Referring to FIG. 4, a first etching solution is used to etch the $SiO_2$ pattern layer 120 and spaces 160 are formed between the lighting structures 140 and the substrate 110. The first etching solution can be a buffered oxide etch (BOE) solution, which is a mixture of the hydrofluoric acid (HF) and ammonium fluoride ($NH_4F$). The BOE solution can effectively etch the $SiO_2$ pattern layer 120 and form the spaces 160 at a position where the $SiO_2$ pattern layer 120 has been.

Figure 5:
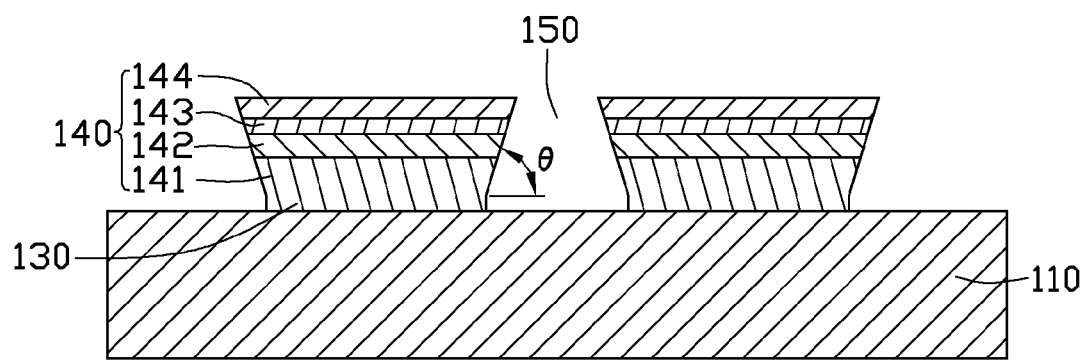

Referring to FIG. 5, a second etching solution is provided to permeate through the gaps 150 between the lighting structures 140 and flow into the spaces 160. Therefore, the second etching solution is etching the side walls and bottom surface of the lighting structure 140 at the same time and thus the lighting structure 140 with a trapezoid shape is formed, wherein the sidewalls of each lighting structure 140 are inclined inwardly along a top-to-bottom direction. In this embodiment, the second etching solution is KOH solution and concentration of the KOH solution is between 2 mol/L and 7 mol/L. In the etching process, the temperature of the KOH solution is heated to between 50° C. and 100° C. and etching the side walls and bottom surface of the lighting structure 140 for about 5 minutes to 30 minutes. Therefore, the trapezoid shape of the lighting structure 140 is formed. Because the side walls of the lighting structure 140 are inclined inwardly to the bottom surface thereof, the total reflection of light from the side walls to the bottom surface of the lighting structure 140 is reduced and the total reflection of light from the side walls to an upper surface of the lighting structure 140 is increased, thereby to promote the light-extraction efficiency of the lighting structure 140. In this embodiment, the side walls of the lighting structure 140 is flat and an include angle between each of the side walls and an upper surface of the substrate 110 is between 57 degrees and 62 degrees. The KOH solution etches the GaN lighting structure 140 in a manner as following:

$$2GaN + 3H_2O \xrightarrow{KOH} Ga_2O_3 + 2NH_3$$

In a preferably embodiment, the KOH solution is with a concentration of 2 mol/L and at a temperature of 75° C. to etch the semiconductor lighting structure 140 for 15 minutes, whereby the TIP structure of the semiconductor lighting structure 140 can be formed and the lighting extraction efficiency of the semiconductor lighting structure 140 can be improved. In this embodiment, an include angle between a side surface of the semiconductor lighting structure and substrate is between 57 degrees and 62 degrees.

Figure 6:
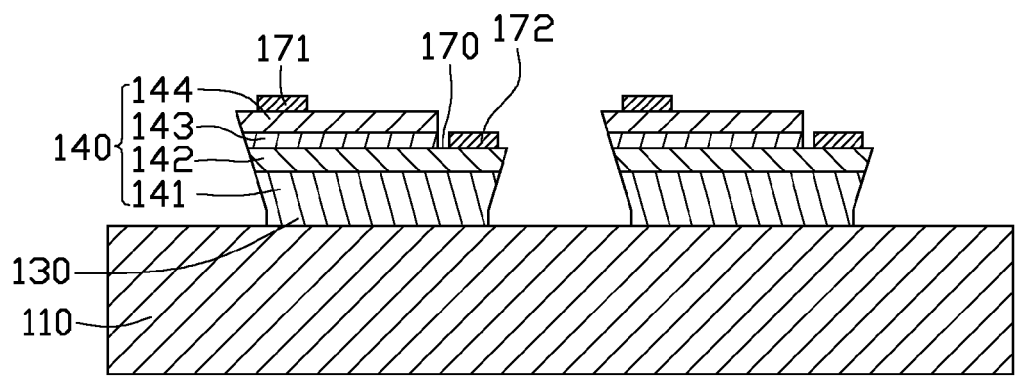

Referring to FIG. 6, a part of the lighting structure 140 is etched to form a platform 170. The platform 170 is formed by etching a part of the p-type GaN layer 144 and the InGaN/GaN multiple quantum well (MQW) layer 143 to expose a part of a top surface of the n-type GaN layer 142. An n-type contact electrode 172 is formed on the platform 170 to electrically contact the n-type GaN layer 142. A p-type contact electrode 171 is formed on a top surface of the p-type GaN layer 144 and electrically contacts the p-type GaN layer 144. The p-type contact electrode 171 and the n-type contact electrode 172 are used to couple with external power source via wire bonding (not shown) to provide driving current to the lighting structure 140.

Figure 7:
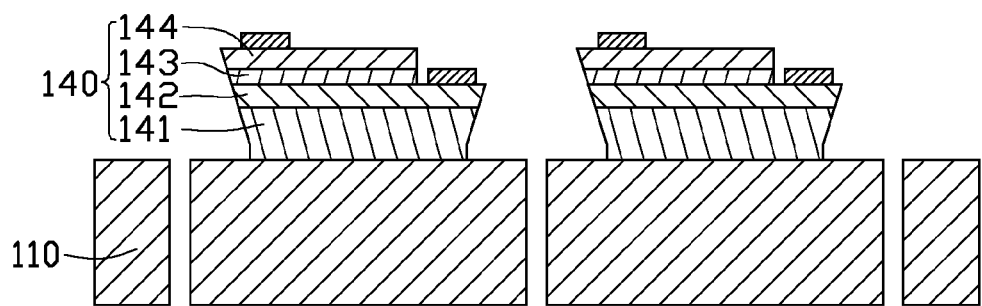

Referring to FIG. 7, the substrate 110 is severed along the gaps 150. Therefore, a plurality of LED chips 100 is formed.

Figure 8:
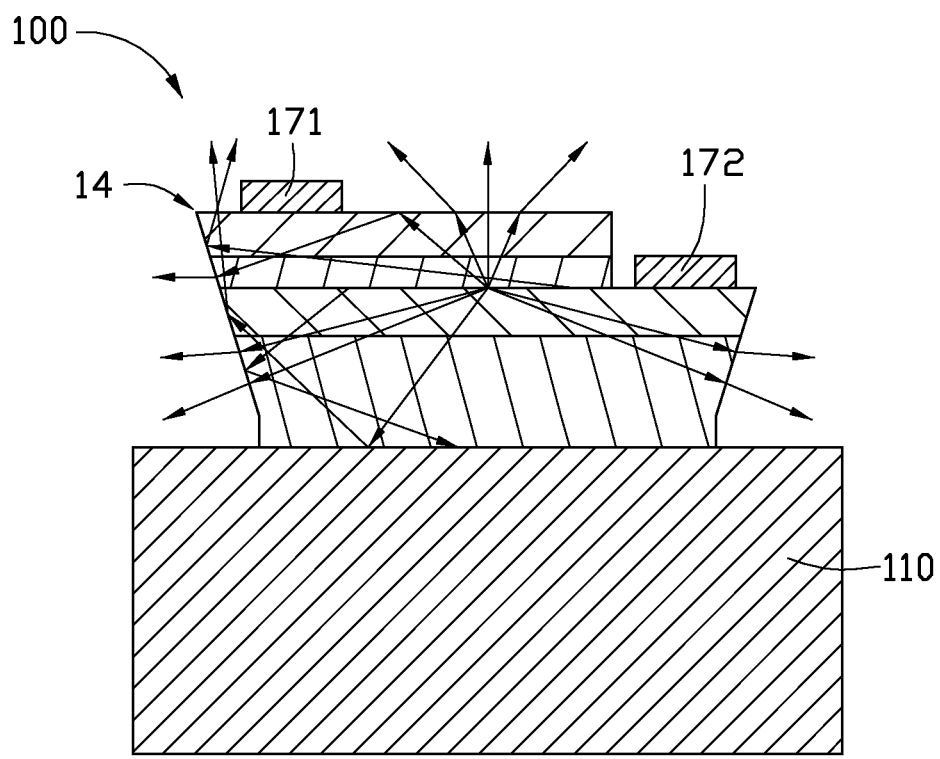

Referring to FIG. 8, when a voltage is applied between the p-type contact electrode pad 171 and the n-type contact electrode pad 172, holes in the p-type GaN layer 144 and electrons in the n-type GaN layer 142 will recombined in the InGaN/GaN MQW layer 143 and energy is released in a form of lighting. When light emitted from the InGaN/GaN MQW layer 143 reaches the side walls of the LED chip 100, total reflection of the light from the side walls to the bottom surface of the LED chip 100 is reduced. For example, a first part of light emitted from the InGaN/GaN MQW layer 143 travels towards the upper surface of the LED chip 100. If an incident angle of the first part of light is larger than 24.6 degrees, the first part of light will be totally reflected by the upper surface of the LED chip 100, and then travels to the side walls of the LED chip 100 from where the first part of light radiates out of the LED chip 100 into the environment. A second part of light emitted from the InGaN/GaN MQW layer 143 travels towards the bottom surface of the LED chip 100. If an incident angle of the second part of light is larger than 48.6 degrees, it will be totally reflected by the bottom surface of the LED chip 100 and redirected to the side walls. And then, the second part of light will also be totally reflected by the side walls and redirected to the outer environment through the upper surface of the LED chip 100.

In this embodiment, the $SiO_2$ pattern layer 120 is previously formed on the bottom surface of the lighting structure 140. Therefore, after the $SiO_2$ pattern layer 120 is etched by the BOE solution, the N-surface (000-1) of GaN structure at the bottom of the lighting structure 140 is exposed to the outer environment. In the operation of etching, the KOH solution can etch the lighting structure 140 from the bottom surface and the side walls at the same time; therefore enhancing the etching speed and reducing the etching temperature. Generally, plane (10-1-1) and plane (11-2-2) are difficult to be etched and left as side walls of the lighting structure 140, and included angles between the two planes (10-1-1), (11-2-2) and the plane (000-1) are 57 degree and 62 degree, respectively.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A method for fabricating an LED chip, comprising:
providing a substrate with a $SiO_2$ pattern layer formed on a portion of a top surface of the substrate, the $SiO_2$ pattern layer dividing another portion of the top surface the substrate without the $SiO_2$ pattern layer thereon into a plurality of epitaxial regions;
growing lighting structures on the epitaxial regions with a gap formed between each two adjacent lighting structures to expose a part of the $SiO_2$ pattern layer between the each two adjacent lighting structures;
permeating a first etching solution into the gap between the each two adjacent lighting structures to etch the $SiO_2$ pattern layer away, and forming spaces between a bottom surface of each of the each two adjacent lighting structures and the substrate;
permeating a second etching solution into the gap and the space to etch a corresponding lighting structure at a bottom surface and side walls of the corresponding lighting structure, thereby forming the corresponding lighting structure with a trapezoid shape with the sidewalls inclined inwardly along a top-to-bottom direction;
forming a p-type contact electrode and an n-type contact electrode on the lighting structure; and
cutting the substrate along the gap between the each two adjacent lighting structures, and forming a plurality of LED chips.

2. The method for fabricating an LED chip of claim 1, wherein the substrate is selected from a group consisting of a sapphire substrate, a SiC substrate and a SiN substrate.

3. The method for fabricating an LED chip of claim 2, wherein the substrate is a patterned sapphire substrate.

4. The method for fabricating an LED chip of claim 1, wherein the $SiO_2$ layer comprises a plurality of lines arranged in a form of a grid structure or parallel strips.

5. The method for fabricating an LED chip of claim 1, wherein a thickness of each of the lines is 20 μm.

6. The method for fabricating an LED chip of claim 1, wherein the first etching solution is a buffered oxide etch solution which is a mixture of the hydrofluoric acid and ammonium fluoride.

7. The method for fabricating an LED chip of claim 1, wherein the second etching solution is a KOH solution.

8. The method for fabricating an LED chip of claim 7, wherein the KOH solution etches the lighting structure at a temperature lower than 100° C.

9. The method for fabricating an LED chip of claim 7, wherein a concentration of KOH solution is between 2 mol/L and 7 mol/L.

10. The method for fabricating an LED chip of claim 7, wherein the KOH solution etches the corresponding lighting structure for 5 minutes to 30 minutes.

11. The method for fabricating an LED chip of claim 1, wherein the semiconductor lighting structure comprises a GaN buffer layer, an n-type GaN layer, an InGaN/GaN MQW structure and a p-type GaN layer arranged subsequently in a direction away from the substrate.

12. The method for fabricating an LED chip of claim 11, further comprising a step of etching a part of the lighting structures to form a platform to expose part of the n-type GaN layer, in which the p-type contact electrode is on the p-type GaN layer and the n-type electrode is on the n-type GaN layer.

* * * * *